United States Patent
Briere (10) Patent No.: US 7,166,898 B2
(45) Date of Patent: *Jan. 23, 2007

(54) FLIP CHIP FET DEVICE

(75) Inventor: Michael Briere, West Greenwich, RI (US)

(73) Assignee: Picor Corporation, North Smithfield, RI (US)

(*) Notice: Subject to any disclaimer, the term of this patent is extended or adjusted under 35 U.S.C. 154(b) by 0 days.

This patent is subject to a terminal disclaimer.

(21) Appl. No.: 11/202,461

(22) Filed: Aug. 12, 2005

(65) Prior Publication Data

US 2005/0269647 A1 Dec. 8, 2005

(51) Int. Cl.
*H01L 29/772* (2006.01)

(52) U.S. Cl. .............. 257/401; 257/203; 257/737; 257/738; 257/773; 257/778; 257/E23.015; 257/E23.021

(58) Field of Classification Search ........... 257/778, 257/758, 773–775, 737–738
See application file for complete search history.

(56) References Cited

U.S. PATENT DOCUMENTS

| | | | |
|---|---|---|---|
| 4,630,357 A | 12/1986 | Rogers et al. | |
| 4,943,539 A | 7/1990 | Wilson et al. | |
| 5,070,391 A | 12/1991 | Liou et al. | |
| 5,148,263 A | 9/1992 | Hamai | |
| 5,158,910 A | 10/1992 | Cooper et al. | |
| 5,306,938 A | 4/1994 | Shirai | |
| 5,355,008 A * | 10/1994 | Moyer et al. | 257/341 |
| 5,365,082 A | 11/1994 | Gill et al. | |
| 5,391,517 A | 2/1995 | Gelatos et al. | |
| 5,412,239 A * | 5/1995 | Williams | 257/343 |
| 5,429,989 A | 7/1995 | Fiordalice et al. | |
| 5,442,235 A | 8/1995 | Parrillo et al. | |

(Continued)

FOREIGN PATENT DOCUMENTS

EP 0 845 815 6/1998

(Continued)

OTHER PUBLICATIONS

Nassif-Khalil et al., *Low Voltage CMOS Compatible Power MOSFET for On-Chip DC-DC Converters*, Proceedings of 12th International Symposium on Power Semiconductors and ICs (ISPSD-2000), IEEE Press 0-7803-6269-1/00, pp. 43-46.

(Continued)

*Primary Examiner*—Jerome Jackson
*Assistant Examiner*—Paul Budd
(74) *Attorney, Agent, or Firm*—Fish & Richardson P.C.

(57) ABSTRACT

In accordance with one embodiment of the invention, a semiconductor device includes conductive pad areas, and each conductive pad area is electrically connected to a plurality of metal traces which are in turn each connected to diffusions. A conductive contact element such as a solder bump or via can be attached to each conductive pad area such that the contact elements are arranged in a repeating pattern having a first pitch. The semiconductor device can also include translation traces, and each translation trace can be electrically connected to two or more of the conductive contact elements. Each translation trace can have a interconnect element attached thereto. The interconnect elements can be arranged in a repeating pattern having a second pitch substantially greater than the first pitch.

22 Claims, 6 Drawing Sheets

U.S. PATENT DOCUMENTS

| | | | |
|---|---|---|---|
| 5,476,817 A | 12/1995 | Numata | |
| 5,477,082 A | 12/1995 | Buckley, III et al. | |
| 5,527,739 A | 6/1996 | Parrillo et al. | |
| 5,578,841 A | 11/1996 | Vasquez et al. | |
| 5,612,566 A | 3/1997 | Williams | |
| 5,633,199 A | 5/1997 | Fiordalice et al. | |
| 5,640,049 A | 6/1997 | Rostoker et al. | |
| 5,672,894 A * | 9/1997 | Maeda et al. | 257/343 |
| 5,677,239 A | 10/1997 | Isobe | |
| 5,682,048 A | 10/1997 | Shinohara et al. | |
| 5,710,451 A | 1/1998 | Merchant | |
| 5,710,455 A | 1/1998 | Bhatnagar et al. | |
| 5,731,732 A | 3/1998 | Williams | |
| 5,756,395 A | 5/1998 | Rostoker et al. | |
| 5,777,383 A | 7/1998 | Stager et al. | |
| 5,817,546 A | 10/1998 | Ferla et al. | |
| 5,844,275 A | 12/1998 | Kitamura et al. | |
| 5,847,466 A | 12/1998 | Ito et al. | |
| 5,869,371 A | 2/1999 | Blanchard | |
| 5,898,217 A | 4/1999 | Johnston | |
| 5,903,469 A | 5/1999 | Ho | |
| 5,999,726 A | 12/1999 | Ho | |
| 6,005,271 A * | 12/1999 | Hshieh | 257/341 |
| 6,046,473 A | 4/2000 | Blanchard | |
| 6,069,400 A | 5/2000 | Kimura et al. | |
| 6,075,293 A | 6/2000 | Li et al. | |
| 6,124,627 A | 9/2000 | Rodder et al. | |
| 6,127,233 A | 10/2000 | Rodder | |
| 6,159,841 A * | 12/2000 | Williams et al. | 438/619 |
| 6,180,265 B1 | 1/2001 | Erickson | |
| 6,189,771 B1 | 2/2001 | Maeda et al. | |
| 6,193,143 B1 | 2/2001 | Ishikawa | |
| 6,228,719 B1 | 5/2001 | Frisina et al. | |
| 6,239,491 B1 | 5/2001 | Pasch et al. | |
| 6,246,091 B1 | 6/2001 | Rodder | |
| 6,251,501 B1 | 6/2001 | Higdon et al. | |
| 6,251,736 B1 | 6/2001 | Brambilla et al. | |
| 6,251,740 B1 | 6/2001 | Johnson et al. | |
| 6,273,328 B1 | 8/2001 | Maeda et al. | |
| 6,277,728 B1 | 8/2001 | Ahn et al. | |
| 6,278,264 B1 * | 8/2001 | Burstein et al. | 323/282 |
| 6,313,007 B1 | 11/2001 | Ma et al. | |
| 6,319,780 B2 | 11/2001 | Crivelli et al. | |
| 6,319,844 B1 | 11/2001 | Usami et al. | |
| 6,331,447 B1 | 12/2001 | Ho | |
| 6,332,569 B1 | 12/2001 | Cordes et al. | |
| 6,350,637 B1 | 2/2002 | Maurelli et al. | |
| 6,358,837 B1 | 3/2002 | Miller et al. | |
| 6,371,100 B2 | 4/2002 | Sekiya | |
| 6,373,100 B1 | 4/2002 | Pages et al. | |
| 6,379,159 B1 | 4/2002 | Mune et al. | |
| 6,392,290 B1 | 5/2002 | Kasem et al. | |
| 6,392,428 B1 | 5/2002 | Kline et al. | |
| 6,395,629 B1 | 5/2002 | Sidhwa et al. | |
| 6,404,010 B2 | 6/2002 | Saggio et al. | |
| 6,410,379 B2 | 6/2002 | Wahlstrom | |
| 6,411,160 B1 | 6/2002 | Riho et al. | |
| 6,417,575 B2 | 7/2002 | Harrada et al. | |
| 6,479,877 B1 * | 11/2002 | Koyama et al. | 257/401 |
| 2001/0045635 A1 * | 11/2001 | Kinzer et al. | 257/685 |
| 2002/0076851 A1 * | 6/2002 | Eden et al. | 438/106 |
| 2002/0105009 A1 | 8/2002 | Eden et al. | |
| 2002/0160563 A1 | 10/2002 | Ghoshal | |
| 2003/0036256 A1 | 2/2003 | Efland et al. | |
| 2003/0040131 A1 | 2/2003 | Kai | |
| 2003/0122247 A1 | 7/2003 | Joshi | |

FOREIGN PATENT DOCUMENTS

| | | |
|---|---|---|
| EP | 0 859 414 | 8/1998 |

OTHER PUBLICATIONS

M. Darwish, Scaling Issues in Lateral Power MOSFETs, Proceedings of 10th International Symposium on Power Semiconductors and ICs (ISPSD-1998), ISBN 0-7803-4752-8, pp. 329-332.

Sun et al., 0.35um, 43 micro-ohm-cm2, 6 mohm Power MOSFET to Power Future Microprocessor, Proceedings of 11th International Symposium on Power Semiconductors and ICs (ISPSD-1999), IEEE Press 0-7803-5290-4/99, pp. 77-80.

Ludikhuize et al., Extended (180V) Voltage in 0.6 um Thin Layer SOI A-BCD3 Technology on 1 um BOX Display, Automotive & Consumer Applications, Proceedings of 14th International Symposium on Power Semiconductors and ICs (ISPSD-2002), ISBN 0-7803-7318-9, pp. 77-80 N.X.

Sun et al., Design of a 4 MHz, 5V to 1 V Monolithic Voltage Regulator Chip, Proceedings of 14th International Symposium on Power Semiconductors and ICs (ISPSD-2002), ISBN 0-7803-7318-9, pp. 217-220.

Kniffin et al., Physical Compact Modeling of Layout Dependent Metal Resistance in Integrated LDMOS Power Devices, Proceedings of 12th International Symposium on Power Semiconductors and ICs (ISPSD-2000), IEEE Press 0-7803-6269-1/00, pp. 173-176.

Pages et al., Advanced Power Copper technology for SMARTMOS Application Designs, Proceedings of 12th International Symposium on Power Semiconductors and ICs (ISPSD-2000), IEEE Press 0-7803-6269-1/00, pp. 141-144.

Chung et al., Energy Capability of Power Devices with Cu Layer Integration, Proceedings of 11th International Symposium on Power Semiconductors and ICs (ISPSD-1999), IEEE Press 0-7803-5290-4/99, pp. 63-66.

Efland et al., Leadframe-On-Chip offers Integrated Power Bus and Bond Bus and Bond over Active Circuit, Proceedings of 13th International Symposium on Power Semiconductors and ICs (ISPSD-2001), ISBN 4-88686-056-7C, pp. 65-68.

Arzumanyan et al., Flip Chip Power MOSFET : A New Wafer Scale Packaging Technique, Proceedings of 13th International Symposium on Power Semiconductors and ICs (ISPSD-2001), ISBN 4-88686-056-7C, pp. 251-254.

* cited by examiner

FLIP CHIP FET DEVICE

CROSS-REFERENCE TO RELATED APPLICATIONS

This application claims priority under 35 U.S.C. § 120 to U.S. patent application Ser. No. 10/327,691, entitled "Flip Chip Fet Device," filed by Michael Briere on Dec. 20, 2002, the entirety of which is hereby incorporated by reference.

TECHNICAL FIELD

Certain embodiments relate to field-effect-transistor (FET) semiconductor devices, and more particularly to interconnects and packaging for metal oxide semiconductor field effect transistor (MOSFET) devices.

BACKGROUND

Power MOSFET devices typically include a plurality of individual MOSFETs fabricated in a pattern to form a MOSFET array. Advances in high-resolution lithography permit individual MOSFETs in the array to be densely grouped together on a semiconductor substrate, increasing the total number of individual MOSFETs per unit area. Theoretically, a higher number of individual MOSFETs operating in parallel within a single MOSFET array will decrease the overall on-state resistance in the MOSFET array. In practice, however, there are various technical and geometric limitations on closely packed MOSFETs in a MOSFET array. For instance, the use of MOSFET devices in power conversion systems is limited by the on-state resistance per unit area, the input capacitance per unit area, the gate resistance per unit area, the source-to-drain withstand voltage capacity, the packaging inductance and external interconnects, and the thermal conductivity to remove heat from the semiconductor device.

For a semiconductor device having small geometries, such as a MOSFET device having lithographically defined gate lengths of less than 1 µm, the on-state resistance can be the limiting factor due to the noticeable contribution of resistance from the overlying metal interconnect layers carrying electric current to the source and drain regions. The impact of on-state resistance is even more pronounced for power MOSFET devices because the dimensions required to optimize the on-state resistance for the small geometry components are not compatible with the large amount of current carried by some power MOSFET devices.

SUMMARY

In accordance with one embodiment of the invention, a semiconductor device includes conductive pad areas, and each conductive pad area is electrically connected to a plurality of metal traces which are in turn each connected to diffusions. A conductive contact element such as a solder bump or via can be attached to each conductive pad area such that the contact elements are arranged in a repeating pattern having a first pitch. The semiconductor device can also include translation traces, and each translation trace can be electrically connected to two or more of the conductive contact elements. Each translation trace can have a interconnect element attached thereto. The interconnect elements can be arranged in a repeating pattern having a second pitch substantially greater than the first pitch.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION OF ILLUSTRATIVE EMBODIMENTS

Figure 1:
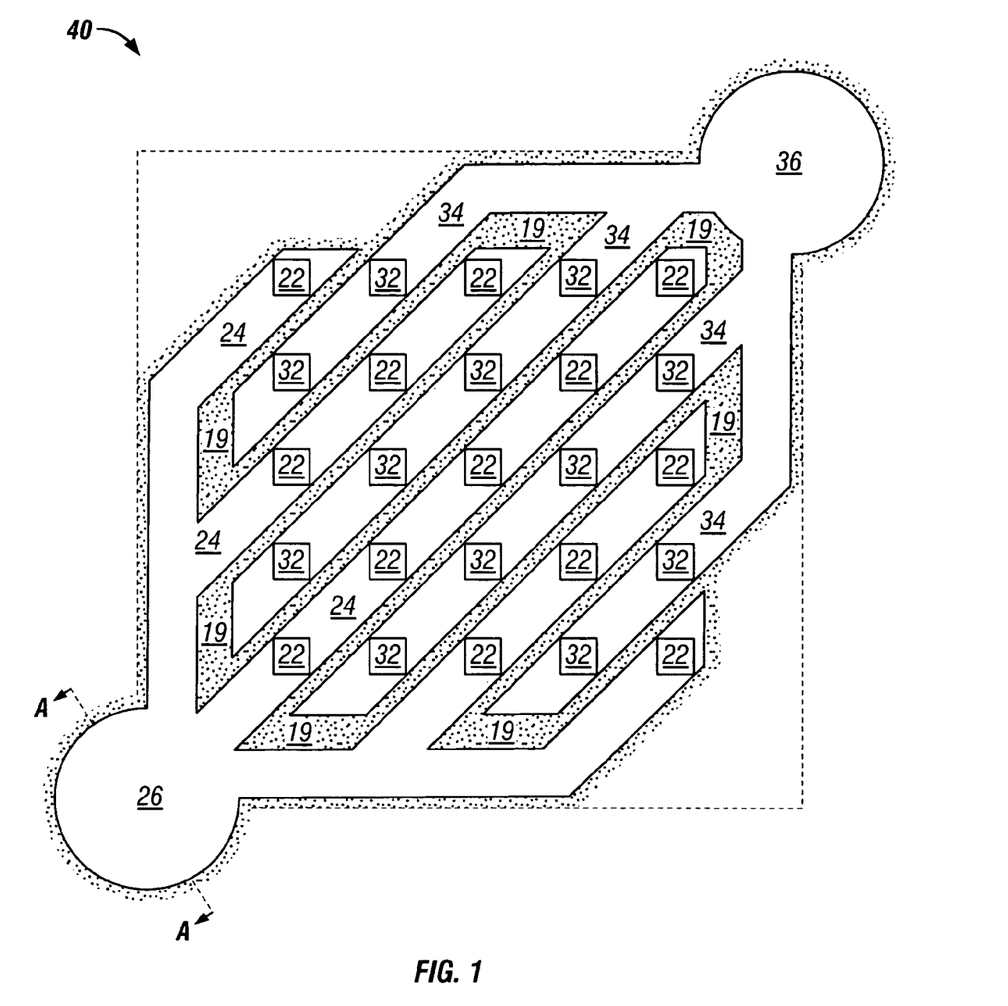
FIG. 1 is a top plan view of a MOSFET array in accordance with one embodiment of the invention.

FIG. 1 depicts one embodiment of an array 40 of semiconductor devices. In accordance with one embodiment of the invention, the semiconductor devices may be MOSFET devices, but the description of such an embodiment should not be construed so as to limit the invention to such devices. FIG. 1 depicts a MOSFET array 40, wherein densely grouped individual MOSFETs are arranged in parallel. As shown in FIG. 1, a source trace 24 may be coupled to one or more source contacts 22, and similarly, a drain trace 34 may be coupled to one or more drain contacts 32. The source contacts 22 and the drain contacts 32 can be coupled to source or drain diffusions (not shown) of the MOSFET devices in a conventional manner. Each source contact 22 can be coupled to a source conductive trace 24, and each drain contact 32 can be coupled to a drain conductive trace 34. The source traces 24 may be divided from the drain traces 34 by a separation layer 19, comprising a nonconductive material. The source traces 24 may intersect at a source pad area 26 such that the source pad area 26 is electrically connected to each source contact 22 in the MOSFET array 40. The drain traces 34 may intersect at a drain pad area 36, and the drain pad area 36 may be electrically connected to each drain contact 32 in the MOSFET array 40. The pad areas 26 and 36 may be relatively large areas of conductive material, such as metal, with positions optimized for proper spacing of conductive elements 28 and 38 (not shown in FIG. 1, described later). In FIG. 1, the gates of the device (not shown) can run vertically and horizontally in a cross-hatched pattern. In such embodiments, square source regions are located below the source contacts 22 and square drain regions are located below the drain contacts 32, forming a checkerboard pattern of alternating source and drain regions at the device level that may be referred to as a cellular arrangement. It will be appreciated by those skilled in the art that the gates could alternatively run parallel to the source and drain traces 24,34 in FIG. 1. In this case, a linear or "striped" arrangement of alternating rows or stripes of source and drain regions at the device level results. Alternatively, a linear arrangement may include source and drain traces 24 and 34 running vertically, instead of diagonally as shown in FIG. 1.

Figure 2:
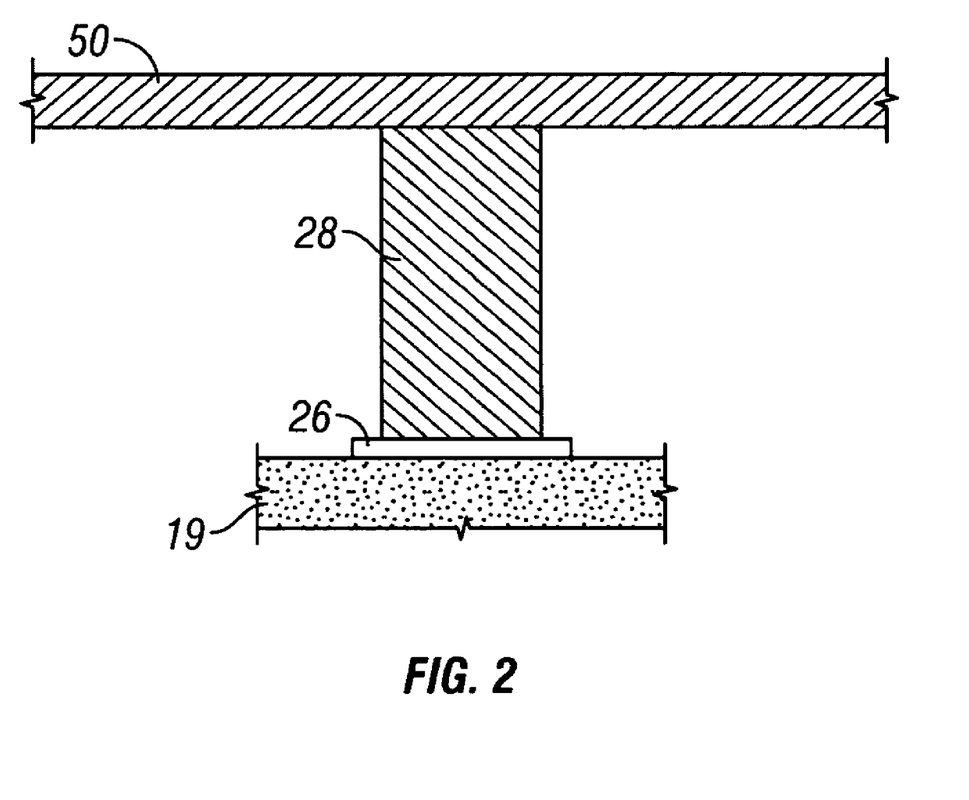
FIG. 2 is a cross-sectional view of a portion of the FIG. 1 MOSFET array along cross section A—A of FIG. 1.
Figure 3:
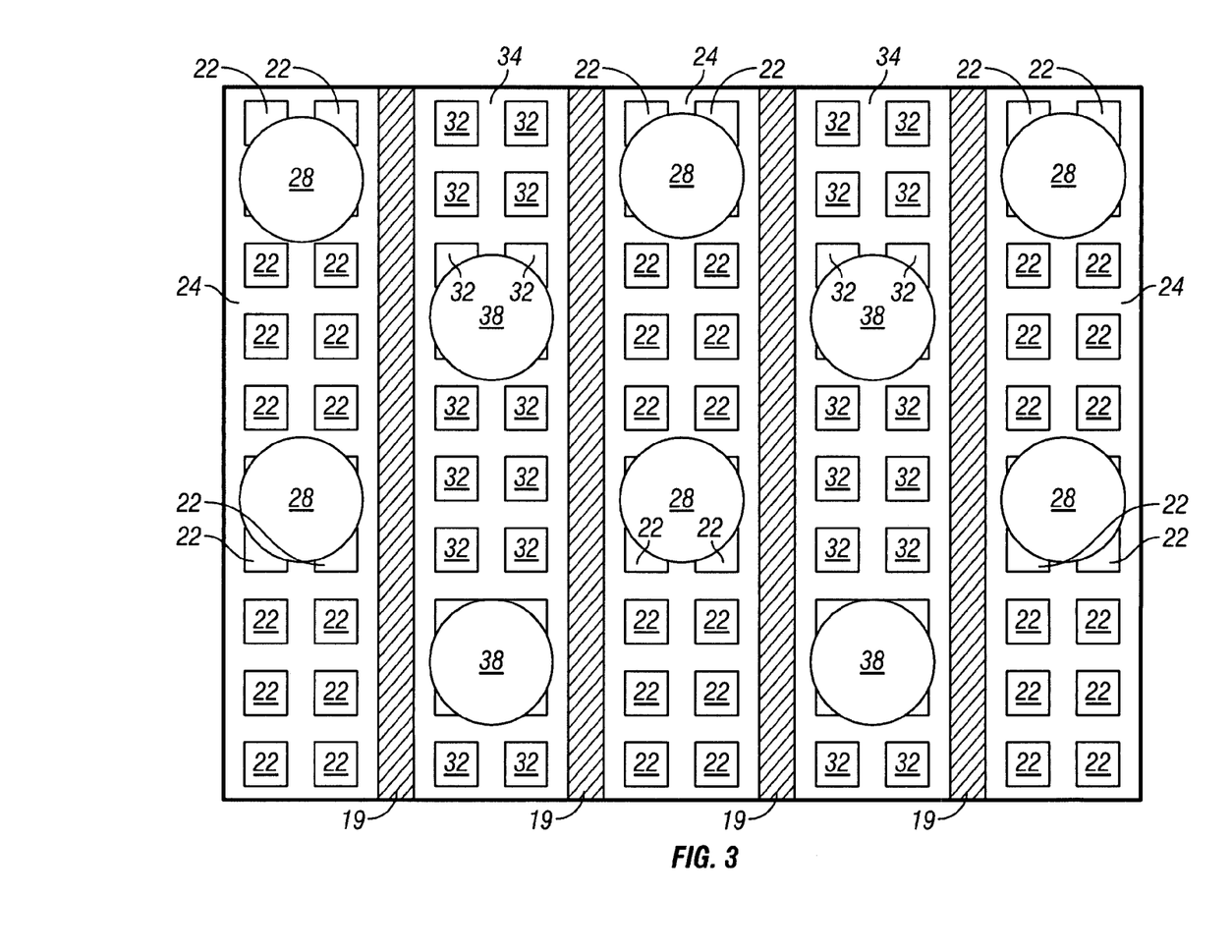
FIG. 3 is a top plan view of a MOSFET array in accordance with another embodiment of the invention.

As shown in FIG. 2, a conductive element such as via 28 may establish an electrical connection from the source pad area 26 to a translation trace 50. Similarly, a drain via 38 (not shown in FIG. 2) may establish an electrical connection from the drain pad area 36 to another translation trace 60 (not shown in FIG. 2). The via 28 may be surrounded by an insulating layer (not shown) such as an oxide layer, as is conventional in the art. Returning to FIG. 1, it can be seen that the pad areas 26 and 36, and thus source and drain vias 28 and 38 (not shown in FIG. 1), are not directly over active device regions. This may be referred to as an "off-active" arrangement. In other embodiments, the source and drain contact elements 28 and 38 can be positioned over the active regions. This arrangement may be referred to as an "on-active" arrangement. FIG. 3 shows an example of an on-active arrangement. Similar to FIG. 1, source traces 24 may intersect one or more source contacts 22, and drain traces 34 may intersect one or more drain contacts 32. In FIG. 3, vias 28 and 38 are positioned over active areas and connect source and drain traces 24, 34 to translation traces (not shown in FIG. 3).

The translation traces can be composed of a low sheet resistance layer. For instance, the translation traces may be about 2 to about 40 um thick Cu (sheet rho 10 to 0.5 mohm/sq), preferably about 10 to about 35 um thick Cu, and more preferably about 20 to about 30 um thick Cu. As another example, the translation traces can be comprised of about 2 to about 4 um thick Al having a sheet rho of about 20 to about 10 mohm/sq. Use of relatively thick translation traces and/or fabricating the traces with relatively low resistance materials may help reduce the on state resistance contribution of the interconnect and translation layer.

Figure 4:
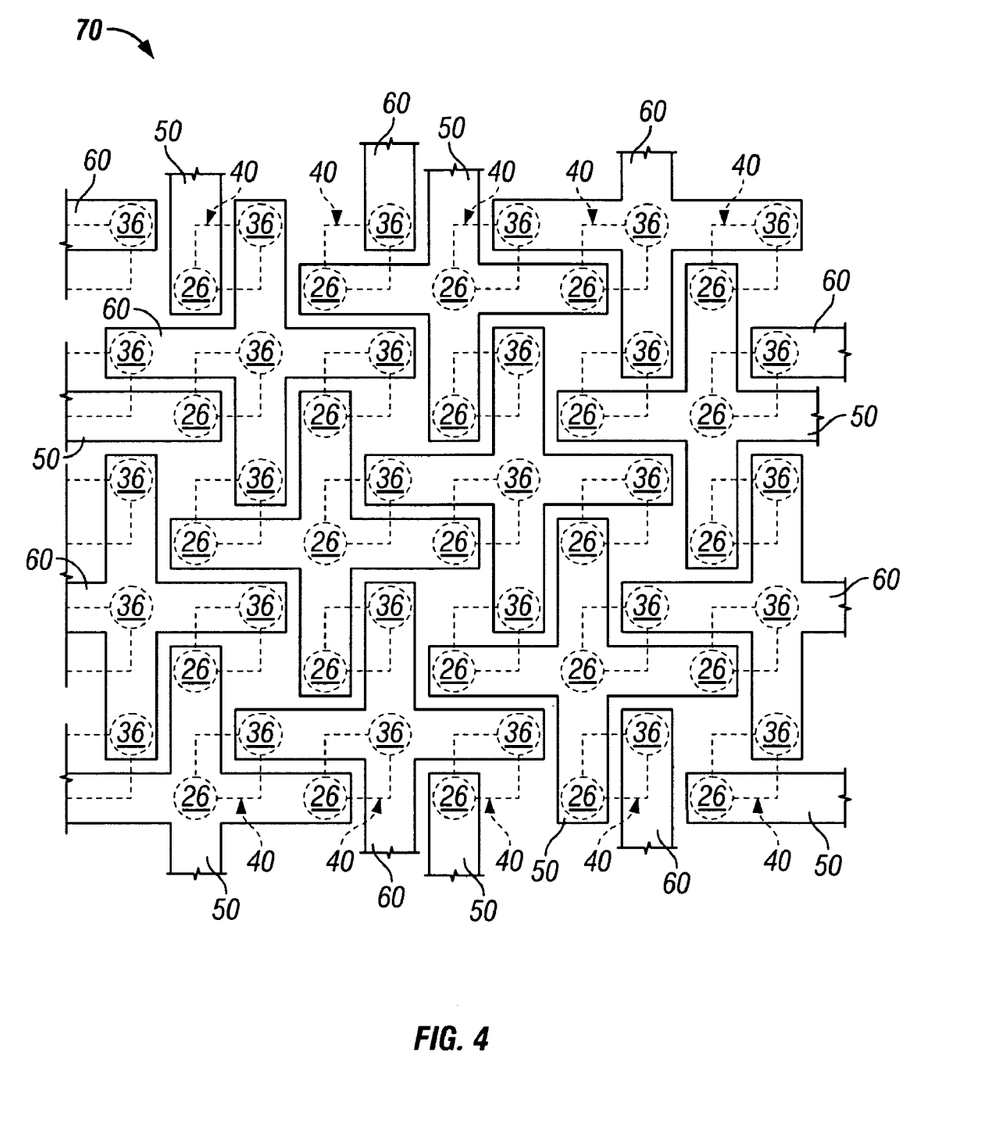
FIG. 4 is a top plan view of MOSFET arrays connected by translation traces in accordance with one embodiment of the invention.

FIG. 4 shows a plan view of a portion of a MOSFET device 70, which includes a pattern of MOSFET arrays 40. As discussed in connection with FIGS. 1 and 2, each MOSFET array 40 can be electrically connected to pad areas 26 and 36, which in turn can be coupled with vias 28 and 38. In FIG. 4, the pad areas 26, 36 are located on a lower metal layer, as indicated by the dashed circles. FIG. 4 shows that the pad areas 26 and 36 (and thus the vias 28, 38 attached thereto, not shown) are arranged in a repeating pattern having a constant pitch, or distance between center points of adjacent vias. For example, in one embodiment the vias may have a pitch between about 200 um and 300 um. In addition, source pads 26 can be electrically connected to only the source translation traces 50 (through vias 28, not shown in FIG. 4) while the drain pads 36 can electrically connected to only the drain translation traces 60 (through vias 38, not shown in FIG. 4). In this embodiment, the source translation traces 50 have a cross (+) shape so as to establish an electrical connection with a group of five adjacent source pads 26. The drain translation traces 60 have a similar pattern so as to establish contact with a group of five adjacent drain pads 36.

Figure 5:
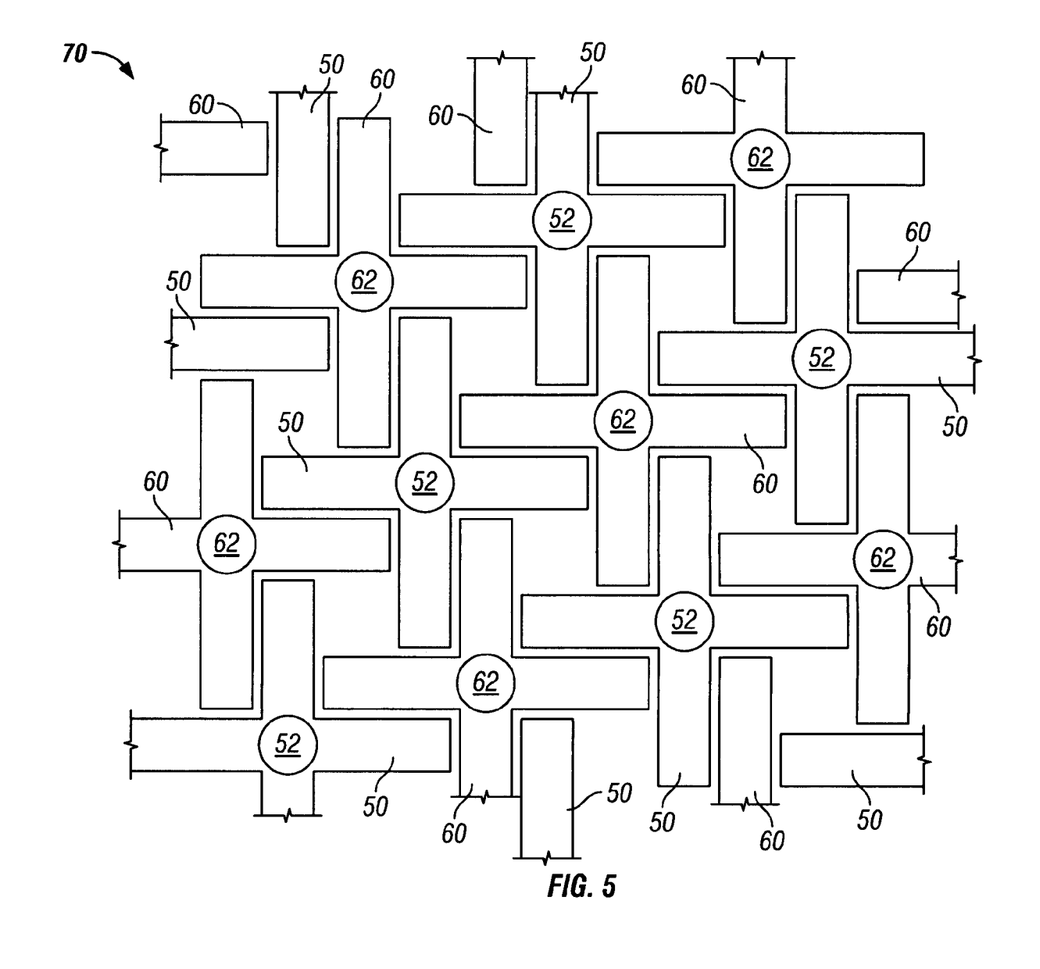
FIG. 5 is plan view of an array of solder bumps positioned atop the translation traces of FIG. 4 in accordance with one embodiment of the invention.

FIG. 5 shows the translation traces 50,60 from FIG. 4. Each translation trace 50 or 60 may have a mounting element, such as an interconnect solder ball 52 or 62, respectively, attached thereto. For some fabrication techniques, the relative size of solder balls 52,62 may be larger than that depicted in FIG. 5. In this embodiment of the invention, a solder ball 52 may be attached to each source translation trace 50 at the center of the cross (+) shape. Similarly, a solder ball 62 may be attached to each drain translation trace 60 at the center of the cross (+) shape.

Figure 6:
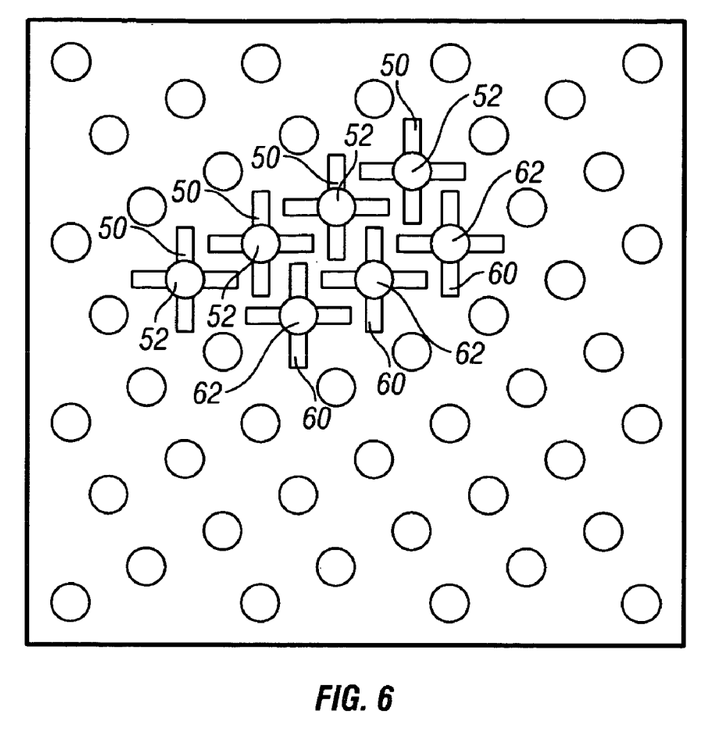
FIG. 6 is plan view of an array of solder bumps positioned atop translation traces in accordance with another embodiment of the invention.

As seen in FIG. 5, in this embodiment of the invention the nearest neighbors to a given solder ball 52 or 62 are not like-minded. That is, a given solder ball (52 or 62) has nearest neighbors that are of the opposite type (62 or 52). For example, a given source solder ball 52 has four nearest neighbor drain solder balls 62, while the closest source balls 52 are further away. Similarly, a given drain solder ball 62 has four nearest neighbor source solder balls 52, while the closest drain balls 62 are further away. FIG. 6 shows an alternative arrangement of translation traces 50, 60, and solder balls 52,62.

Some embodiments may include source and drain traces 24,34 on different metal layers. To reduce on-state resistance, each metal layer 24,34 can cover substantially the entire chip or a substantial fraction of the chip. In such embodiments, vias can extend through the intervening layer (e.g. the source metal layer) to carry signals to the doped silicon regions (e.g. the MOSFET drain region) or to another metal layer with the appropriate clearance to facilitate fabrication. The arrangement shown in FIG. 5, wherein nearest neighbors are not common (i.e. not tied to the same terminal), may reduce the extent to which the intervening layer is interrupted by the vias. Vias in such embodiments are spaced more widely than in embodiments wherein, e.g., source solder bumps and their underlying vias are arranged in rows or columns.

Figure 7:
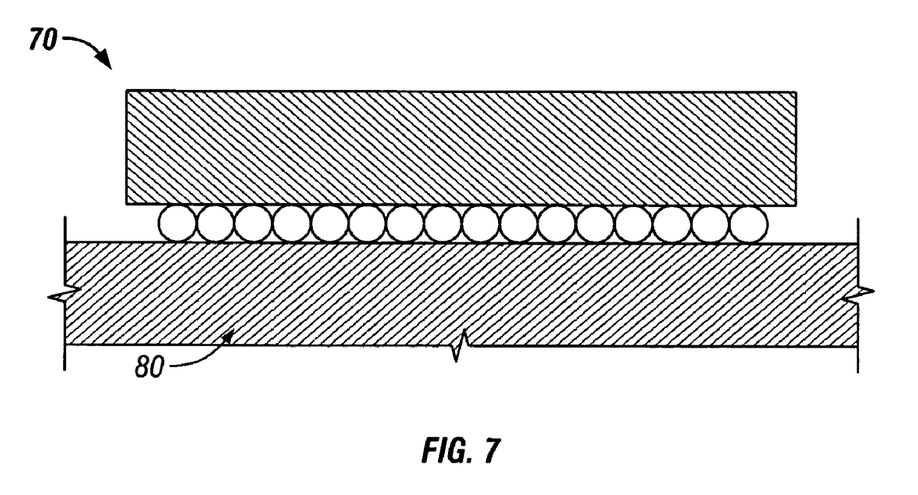
FIG. 7 is a side view of the MOSFET device from FIG. 6 that is connected to a substrate in accordance with one embodiment of the invention.

As shown in FIGS. 5–7, the solder balls 52 and 62 may be formed in a ball grid array (BGA) pattern so as to establish an interconnect with a substrate 80 external to the MOSFET device 70. In one embodiment of the invention, the substrate 80 may be a printed circuit board with an array of conductive pads corresponding to the BGA pattern on the device 70. The printed circuit board may also house a plurality of electrical conduits such as metal traces for propagating signals which may terminate in any suitable connector or interface, as is known in the art. As such, an electrical signal may propagate through the substrate 80 to a solder ball 52 on the MOSFET device 70. The signal may continue from the solder ball 52 to a corresponding translation trace 50 (see FIG. 5). In turn, the signal may continue from the translation trace 50 to a via 28 that is electrically connected to the trace 50 and then to a corresponding source pad area 26 (see FIG. 2). Further yet, the signal may continue from the source pad area 26 to the source lines 24 that are electrically connected thereto (see FIG. 1). The signal may then continue from the source lines 24 to the source contacts 22 and the corresponding diffusions of the MOSFET array 40. In the embodiments depicted in FIGS. 1–6, a similar path is followed by the drain signal through drain contacts 32, translation lines 60, and solder balls 62.

Referring again to FIGS. 5–6, the solder balls 52 and 62 are arranged in a pattern having a solder ball pitch (i.e., length between adjacent solder balls in the BGA) substantially greater than the pitch of the vias 28 and 38. As such, the translation traces 50 and 60 can increase the external pitch of the device 70 for compatibility with requirements of mounting the device 70 to the substrate 80. For example, in one embodiment the pitch of the vias 28 and 38 can be between about 100 um and 400 um, preferably between about 200 um and 300 um, and more preferably around 250 um. The translation traces 50 and 60 may be used to increase the effective external pitch of the device 70 so that the pitch of the solder balls 52 and 62 is increased by a factor of about 1.1 to 10, preferably about 2 to 5, and more preferably by about 2 to 3.

The size of the MOSFET array 40 (FIG. 1), the metal traces and solder bumps, and the pitch of the vias and solder balls may be selected to optimize the resistance from the overlying metal interconnect layers carrying electric current to the source and drain regions. Accordingly, the total on-resistance may be optimized even for a power MOSFET device carrying large currents and having small-geometry components. In addition, increased thermal conduction and decreased low parasitic inductances may be achieved through use of the topologies discussed herein.

The topologies described above may be modified extensively in accordance with the teachings set forth herein. For instance, the foregoing techniques may be applied to any type of integrated circuit, including but not limited to diodes, JFETs, BJTs, and NMOS, PMOS, or CMOS FETs. Although a discrete power-FET array was illustrated above, the techniques described herein may be applied in connection with integrated devices which include, for example, control logic, and any transistor or diode layout may be used. The layout may use any desired number of metal layers, interconnects and polysilicon layers. For instance, the pad areas may be connected to the diffusions with 2, 3, 4 or more separate layers of metal which are connected with vias or other known means. Organic or polymeric traces may be used as well. Vias and contacts are discussed above in connection with certain preferred embodiments; those skilled in the art will understand that any suitable conductive element can be used to connect the various silicon regions and metal layers. Likewise, alternate conductive layers could be used in place of the solder bumps or balls, such as terminated ball bonds, stud bumps with gold wires, or the like. The chip-side conductive elements can have any desired spacing, repeating pattern, or non-repeating pattern. The mounting elements may likewise be fabricated from any conductive substance and have any desired form, including but not limited to metal solder bumps or balls. The traces, conductive elements, and mounting elements discussed herein need not be separately formed, but instead may be integrally formed in the same fabrication step. The mounting elements need not serve as interconnects to off-chip components, but instead can be connected to other elements which in turn serve as interconnects.

The translation traces may have any desired configuration and may serve to electrically connect any desired number of chip-side conductive elements. For example, the semiconductor device may have additional layers of translation traces 50 and 60 to further increase the external pitch of the ball grid array. In addition, the translation trace 50 and 60 may be of a shape other than a cross (+), such as an L-shape (L), a T-shape (T), or any other shape that enables the translation traces to be electrically connected to two or more conductive elements 28 and 38.

A number of embodiments of the invention have been described. Nevertheless, it will be understood that various modifications may be made without departing from the spirit and scope of the invention. Accordingly, other embodiments are within the scope of the following claims.

What is claimed is:

1. A semiconductor device comprising:
   a substrate;
   a plurality of doped silicon regions disposed on the substrate;
   a plurality of metal layers disposed above the substrate, including a first metal layer and a second metal layer;
   a plurality of discrete conductive pad areas formed in the first metal layer and arranged in a first pattern that repeats in two dimensions and has a first pitch, the first metal layer being disposed on the doped silicon regions and being the one metal layer of the plurality of metal layers closest to the doped silicon regions, each conductive pad area directly electrically connected to a plurality of doped silicon regions; and
   a plurality of discrete translation traces formed in the second metal layer, each translation trace having a solder element attached thereto and being electrically connected to a plurality of conductive pad areas, the solder elements arranged in a second pattern that repeats in two dimensions and has a second pitch;
   wherein the plurality of metal layers further contains zero, one, or two additional metal layers disposed between the first metal layer and the second metal layer.

2. The device of claim 1, wherein the doped silicon regions form a part of an array of lateral field effect transistors that comprise a power MOSFET device.

3. The device of claim 1, wherein a first set of translation traces connects to drain regions and a second set of translation traces connects to source regions.

4. The device of claim 1, wherein the solder elements form a ball-grid array.

5. The device of claim 1, wherein the translation traces are substantially thicker than other metal layers disposed beneath the translation traces.

6. The device of claim 1, further comprising a printed circuit board attached to the semiconductor device at the solder elements.

7. The device of claim 1, wherein the second pitch is substantially greater than the first pitch.

8. The device of claim 7, wherein the first pitch is between about 200 μm and 300 μm and the second pitch is between about 400 μm and 600 μm.

9. The device of claim 1, wherein the translation traces have a cross-shaped configuration.

10. A printed circuit board, comprising:
    a solid substrate having a plurality of electrical conduits;
    one or more integrated circuits connected to the electrical conduits, at least one integrated circuit comprising:
    a semiconductor substrate;
    a plurality of doped silicon regions disposed on the semiconductor substrate;
    a plurality of metal layers deposited above the semiconductor substrate, including a first metal layer and a second metal layer;
    a plurality of discrete conductive pad areas formed in the first metal layer and arranged in a first pattern that repeats in two dimensions and has a first pitch, the first metal layer being disposed on the doped silicon regions and being the one metal layer of the plurality of metal layers closest to the doped silicon regions, each conductive pad area directly electrically connected to a plurality of doped silicon regions; and
    a plurality of discrete translation traces formed in the second metal layer, each translation trace having a solder element attached thereto and being electrically connected to a plurality of conductive pad areas, the solder elements arranged in a second pattern that repeats in two dimensions and has a second pitch;
    wherein the plurality of metal layers further contains zero, one or two additional metal layers are disposed between the first metal layer and the second metal layer.

11. The printed circuit board of claim 10, wherein the doped silicon regions form a part of an array of lateral field effect transistors that comprise a power MOSFET device.

12. The printed circuit board of claim 11, wherein a first set of translation traces connects to drain regions and a second set of translation traces connects to source regions.

13. The printed circuit board of claim 10, wherein the solder elements form a ball-grid array.

14. The printed circuit board of claim 10, wherein the translation traces are substantially thicker than other metal layers disposed beneath the translation traces.

15. The printed circuit board of claim 10, wherein the second pitch is substantially greater than the first pitch.

16. The printed circuit board of claim 15, wherein the first pitch is between about 200 μm and 300 μm and the second pitch is between about 400 μm and 600 μm.

17. The printed circuit board of claim 10, wherein the translation traces have a cross-shaped configuration.

18. A semiconductor device, comprising:
   a plurality of conductive pad areas, each conductive pad area being electrically connected to a plurality of diffusions and having a conductive contact element attached thereto, the conductive contact elements being arranged in a repeating pattern having a first pitch; and
   a plurality of translation traces, each translation trace electrically connecting two or more of the conductive contact elements and having a solder element attached thereto, the solder elements being arranged in a repeating pattern having a second pitch substantially greater than the first pitch;
   wherein the conductive pad areas are realized in a first metal layer, the translation traces are realized in a second metal layer above the first metal layer and wherein at most two additional metal layers are disposed between said plurality of diffusions and said second metal layer.

19. The device of claim 1, wherein the plurality of metal layers further comprises exactly two additional metal layers disposed between the first metal layer and the second metal layer.

20. The device of claim 1, wherein the plurality of metal layers further comprises exactly one additional metal layer disposed between the first metal layer and the second metal layer.

21. The printed circuit board of claim 10, wherein the plurality of metal layers further comprises exactly two additional metal layers disposed between the first metal layer and the second metal layer.

22. The printed circuit board of claim 10, wherein the plurality of metal layers further comprises exactly one additional metal layer disposed between the first metal layer and the second metal layer.

* * * * *

UNITED STATES PATENT AND TRADEMARK OFFICE
CERTIFICATE OF CORRECTION

| | | |
|---|---|---|
| PATENT NO. | : 7,166,898 B2 | |
| APPLICATION NO. | : 11/202461 | |
| DATED | : January 23, 2007 | |
| INVENTOR(S) | : Michael Briere | |

It is certified that error appears in the above-identified patent and that said Letters Patent is hereby corrected as shown below:

Title Page, item [63] Related U.S. Application Data, please insert --This application is a continuation (and claims the benefit GT of priority under 35 U.S.C. § 120) of U.S. Application Serial No. 10/327,691, filed 12/20/02, now U.S. Patent No. 6,969,909, issued November 29, 2005.--

Signed and Sealed this

Twenty-ninth Day of May, 2007

JON W. DUDAS
*Director of the United States Patent and Trademark Office*

UNITED STATES PATENT AND TRADEMARK OFFICE
CERTIFICATE OF CORRECTION

PATENT NO. : 7,166,898 B2
APPLICATION NO. : 11/202461
DATED : January 23, 2007
INVENTOR(S) : Michael Briere Page 1 of 1

It is certified that error appears in the above-identified patent and that said Letters Patent is hereby corrected as shown below:

Title Page, item [63] Related U.S. Application Data, please insert --This application is a continuation (and claims the benefit of priority under 35 U.S.C. § 120) of U.S. Application Serial No. 10/327,691, filed 12/20/02, now U.S. Patent No. 6,969,909, issued November 29, 2005.--

This certificate supersedes Certificate of Correction issued May 29, 2007.

Signed and Sealed this

Fourteenth Day of August, 2007

JON W. DUDAS
*Director of the United States Patent and Trademark Office*